(12) United States Patent
Mei et al.

(10) Patent No.: US 11,107,153 B2
(45) Date of Patent: Aug. 31, 2021

(54) INTERFACE INCLUDING PASSIVE TOUCH SENSITIVE INPUT DEVICE

(71) Applicant: Palo Alto Research Center Incorporated, Palo Alto, CA (US)

(72) Inventors: Ping Mei, San Jose, CA (US); Janos Veres, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 15 days.

(21) Appl. No.: 16/589,676

(22) Filed: Oct. 1, 2019

(65) Prior Publication Data

US 2021/0097598 A1 Apr. 1, 2021

(51) Int. Cl.
*G06Q 30/06* (2012.01)
*G06F 3/044* (2006.01)
*G06K 7/10* (2006.01)
*G06F 3/043* (2006.01)
*G06F 3/042* (2006.01)
*G06F 3/046* (2006.01)

(52) U.S. Cl.
CPC ....... *G06Q 30/0641* (2013.01); *G06F 3/0448* (2019.05); *G06K 7/10366* (2013.01); *G06F 3/042* (2013.01); *G06F 3/043* (2013.01); *G06F 3/046* (2013.01); *G06F 2203/04106* (2013.01)

(58) Field of Classification Search
CPC ... G06Q 30/0641; G06F 3/0448; G06F 3/042; G06F 3/043; G06F 3/046; G06F 2203/04106; G06K 7/10366
See application file for complete search history.

(56) References Cited

U.S. PATENT DOCUMENTS

| | | | |
|---|---|---|---|
| 6,827,281 B2 | 12/2004 | Edmonson et al. | |
| 9,874,984 B2 | 1/2018 | Mei et al. | |
| 2012/0029691 A1 | 2/2012 | Mockus et al. | |
| 2014/0049505 A1* | 2/2014 | Radivojevic | G06F 3/03547 345/174 |
| 2014/0071095 A1* | 3/2014 | Godsill | G06F 3/043 345/177 |
| 2014/0223383 A1* | 8/2014 | Yarita | H04N 21/42224 715/863 |
| 2015/0022224 A1* | 1/2015 | Ruusunen | G01B 7/003 324/691 |
| 2018/0285811 A1 | 10/2018 | Shaw et al. | |
| 2019/0146588 A1 | 5/2019 | Levesque et al. | |
| 2019/0180065 A1* | 6/2019 | Babakhani | G06K 19/0715 |

* cited by examiner

*Primary Examiner* — Peter D McLoone
(74) *Attorney, Agent, or Firm* — Mueting Raasch Group

(57) ABSTRACT

An input device includes one or more groups of two or more touch sensitive elements. Each group of two or more touch sensitive elements is arranged to generate a sequence of electronic waveforms corresponding to a multi-digit code that identifies the group in response to a swiping touch across the two or more touch sensitive elements.

24 Claims, 15 Drawing Sheets

INTERFACE INCLUDING PASSIVE TOUCH SENSITIVE INPUT DEVICE

BACKGROUND

Touch sensors are used in a wide range of user interface applications including telephones, thermostats, appliances and more. Such sensors allow a user to intuitively interact with electronic devices.

BRIEF SUMMARY

Some embodiments are directed to an interface system that includes at least one input device that operates in conjunction with a reader. The input device comprises one or more groups of two or more touch sensitive elements arranged to generate electronic waveforms upon sensing a swiping touch on or proximate to the two or more touch sensitive elements. A transponder of the input device is electrically connected to the touch sensitive elements and transmits the electronic waveforms to a reader. The reader includes a generator configured to generate a signal that wirelessly powers the touch sensitive elements. The reader also includes receiver that receives the electronic waveforms. A signal processor extracts the electronic waveforms. An output device generates an output in response to the electronic waveforms.

Some embodiments are directed to a method of operating an interface system. The method includes activating at least one group of touch sensitive elements of an input device by a swiping touch on or near the touch sensitive elements. A sequence of electronic waveforms corresponding to a multi-digit code is generated in response to activating the at least one group of touch sensitive elements by the swiping touch. A response signal representing the sequence electronic waveforms is transmitted to a reader. The code is extracted and an output is generated based on the code.

According to some embodiments, an input device comprises one or more groups of two or more touch sensitive elements. Each group of two or more touch sensitive elements are arranged to generate a sequence of electronic waveforms corresponding to a sequential multi-digit code that identifies the group in response to a swiping touch across the two or more touch sensitive elements.

According to some embodiments an interface system includes at least one input device comprising one or more groups that include two or more touch sensitive elements. Each group of two or more touch sensitive elements is arranged to generate a touch response signal comprising a sequence of electronic waveforms corresponding to a sequential multi-digit code that identifies the group in response to a swiping touch across the two or more touch sensitive elements. The interface system further includes a signal processor configured to extract the code from the touch response signal. An output device generates an output responsive to the code.

BRIEF DESCRIPTION OF DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Static touch or swiping touch inputs are popular for smart phones and other mobile devices. This disclosure describes various designs for an input device that accepts user input by static touching or swipe touching on touch sensitive elements. Systems, devices and methods to enable a simple input device based on swiping touch detection and waveform analysis of dynamic signals are disclosed herein.

One example implementation is a point of purchase scenario where it is convenient for a shopper if there are touch sensitive "buttons" on a product. When a shopper picks up an item from a shelf and interacts with various touch sensitive buttons, the product information such as product features, user guide, and other related information, can be shown on an electronic display. Other example implementations of the disclosed systems, devices, and methods include interactive games, remote control devices, user badges, information al brochures, among other implementations.

Figure 1A:
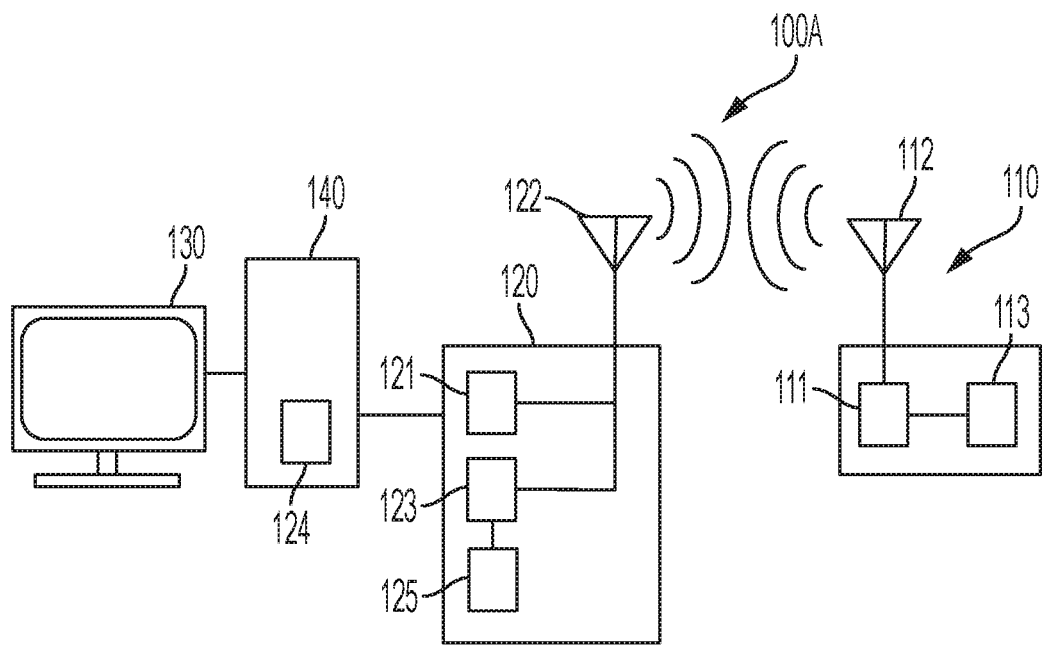
FIG. 1A shows a block diagram of a user interface that relies on wireless signaling in accordance with some embodiments.

FIG. 1A shows a block diagram of a user interface 100A in accordance with some embodiments. The system 100A comprises at least one touch sensing input device 110. In the embodiment shown in FIG. 1A, the touch sensing input device 110 communicates with the reader 120 over a wireless communication link, which is an optional communication scenario.

In some embodiments, the touch sensing device includes an onboard power source. In the embodiment illustrated in FIG. 1A, the touch sensing input device 110 does not include a battery or other on-board power source. Instead of being powered by its own internal power source, the input device 110 can be wirelessly powered by excitation signals generated by a reader 120. The input device 110 includes a transponder 111 that receives the excitation signals generated by the reader 120 and through an antenna 112. In unpowered versions, the transponder 111 harvests energy from the excitation signal to power the input device 110.

The touch sensing input device 110 comprises a touch sensor 113 having multiple touch sensitive elements arranged in groups or "buttons". The touch sensitive elements are electrically coupled to the transponder 111 and are configured to produce electronic waveforms in response to sensing a touch on or proximate to the touch sensitive elements. The touch sensor 113 can include at least one group of two or more touch sensitive elements arranged to sense a swiping touch. Each group of two or more touch sensitive elements can be arranged to generate a sequence of electronic waveforms corresponding to a sequential multi-digit code that identifies the group (button) in response to a swiping touch across the two or more touch sensitive elements. The touch sensor may additionally include one or more individual touch sensitive elements arranged to sense a static touch.

The transponder 111 is electrically connected to the touch sensor 113 so as to receive the sequence of electronic waveforms generated by the touch sensitive elements in response to touches. The transponder 111 transmits a transponder response signal that represents the sequence of electronic waveforms through the antenna 112 to the reader 120.

The reader 120 comprises a signal generator 121 configured to generate the excitation signal. The signal generator 121 is coupled to an antenna 122 such that the excitation signal is transmitted wirelessly through the antenna 122 to the antenna 112 of the input device 110. The reader antenna 122 also receives the transponder signal from the input device 110. A receiver 123 coupled to the antenna 122 is configured to receive the transponder signal from the antenna 122. For example, the receiver 121 may demodulate the transponder signal received from antenna 122.

A signal processor 125 receives the signal from the receiver 123 and extracts the multi-digit code from the response signal. The multi-digit code indicates which group of touch sensitive elements was touched. The signal processor 125 may be a component of the reader 120 or the signal processor 125 may optionally be a component of an accessory device 140 communicatively coupled to the reader 120 as shown in FIG. 1. In the latter scenario, the reader provides a signal to the accessory device 140 that represents the multi-digit code.

An output device 130 generates an output responsive to the code. For example, the output device 130 may display information associated with the multi-digit code or may take other action in response to identification of the code.

Figure 1B:
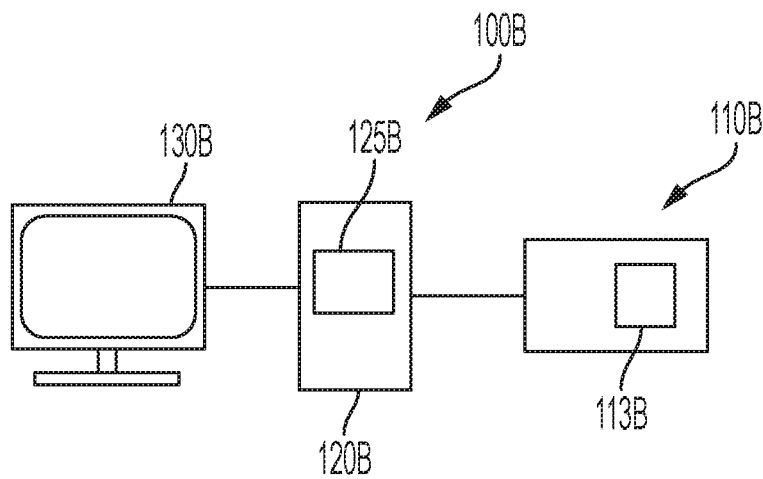
FIG. 1B shows a block diagram of a user interface in accordance with some embodiments.

FIG. 1B illustrates a block diagram of a user interface 100B in accordance with some embodiments. The system 100B comprises at least one touch sensing input device 110B. In the embodiment shown in FIG. 1B the touch sensing input device 110B communicates with the reader 120B over a wired communication link. In some embodiments, the response signal may be transmitted to the reader 120B as an optical signal. Optical communication is particularly useful when the touch sensor are optical sensors.

The touch sensing input device 110B comprises a touch sensor 113B having multiple touch sensitive elements arranged in groups. The touch sensitive elements are electrically coupled to the reader 120B and are configured to produce electronic waveforms upon sensing a touch on or proximate to the touch sensitive elements. The touch sensor 113B includes at least one group of two or more touch sensitive elements arranged to sense a swiping touch. Each group of two or more touch sensitive elements can be arranged to generate a response signal comprising a sequence of electronic waveforms corresponding to a sequential multi-digit code that identifies the group in response to a swiping touch across the two or more touch sensitive elements. The touch sensor may additionally include one or more individual touch sensitive elements arranged to sense a static touch.

The reader 120B may include a signal processor 125B that extracts the multi-digit code from the response signal. The multi-digit code indicates which group of touch sensitive elements was touched. An output device 130B generates an output responsive to the code. For example, the output device 130B may display information associated with the multi-digit code or may take other action in response to identification of the code.

Figure 2:
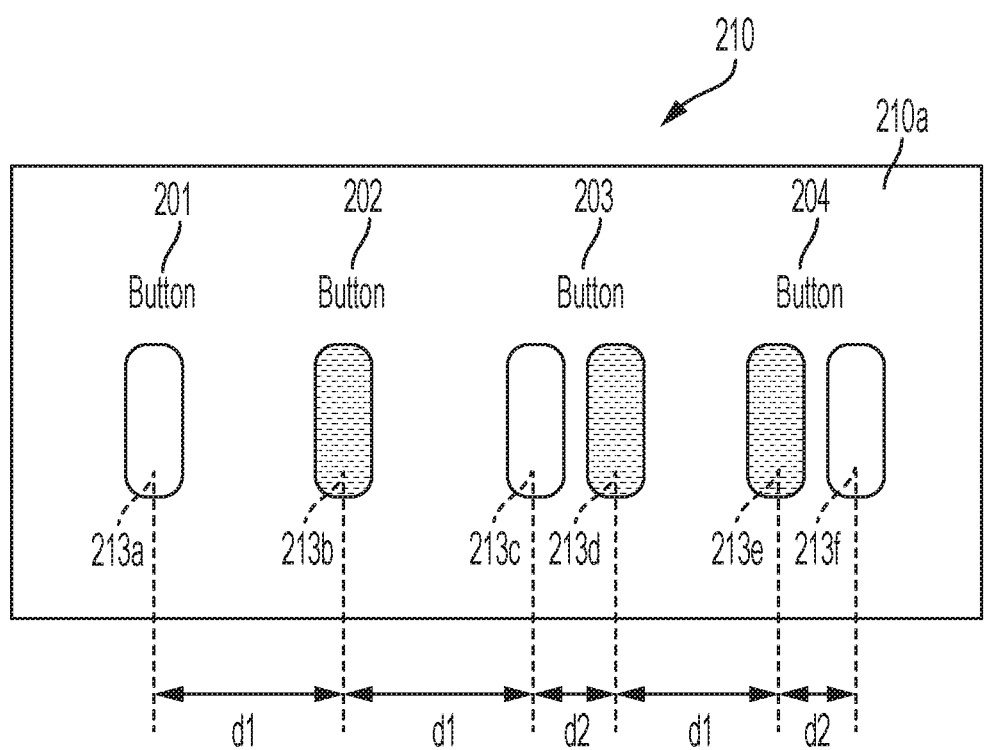
FIG. 2 shows a top view of an input device that includes four groups of touch sensitive elements in accordance with some embodiments.

FIG. 2 shows a top view of an input device 210 that includes four groups of touch sensitive elements (also referred to as "buttons"). The first group (button 201) includes a single touch sensitive element 213a; button 202 also includes a single touch sensitive element 213b; button 203 includes a group of two touch sensitive elements 213c, 213d, and button 204 includes a group of two touch sensitive elements 213e, 213f. It will be appreciated that the input device 210 could include additional groups each including one or more additional touch sensitive elements, e.g., three or more touch sensitive elements.

The touch may be made by a finger or other implement, e.g., a stylus. In some embodiments, the touch sensitive elements 213a-f may be capacitive touch sensors. In some embodiments, the touch sensitive elements 213a-f may be pressure sensors, optical sensors, acoustic or bending wave sensors, magnetic sensors, or any other type of touch sensors. It is also possible for a first touch sensitive element of a group to be a first type of sensor and a second touch sensitive element of a group to be a different type of sensor. For example, element 213c could be capacitive touch sensor and element 213d could be an optical touch sensor.

Buttons 201 and 202 each include a single touch sensitive element 213a, 213b and are suitable for sensing a static touch on or proximate to the surface of the input device 210. Buttons 203 and 204 each have multiple touch sensitive elements 213c, 213d, 213e, 213f, and are suitable for sensing a swiping touch as a finger is swiped from one touch sensitive element 213c, 213e of the button to another touch sensitive element 213d, 213f of the button. The touch sensitive elements of static touch buttons 201 and 202 may be positioned a distance, d1, from each other, e.g., more than about 20 mm center-to-center, to reduce the possibility that a swiping touch between touch sensitive elements 213a and 213b will be erroneously detected.

The distance, d2, between touch sensitive elements 213c, 213d of swiping touch button 203 and between touch sensitive elements 213e, 213f of swiping touch button 204 may be less than ½ d1, e.g., less than about 10 mm center-to-center, to facilitate identification of a swiping touch from the first element 213c, 213e to the second element 213d, 213f of the button. Recognition of a swiping touch on button 203 may be dependent on the time period between the electronic waveforms produced by elements 213c and 213d and recognition of a swiping touch on button 204 may be dependent on the time period between the electronic waveforms produced by elements 213e and 213f. The signal processor may be configured to recognize the speed of the swiping touch across the touch sensitive elements of a button. In some configurations, if the swipe speed is insufficient, the touch may be ignored. In some configurations, a first swipe speed may produce a first output from the output device and a second swipe speed may produce a second output from the output device.

In some cases, the signal processor may be configured to discriminate between swiping touches on a button in opposite directions. For example, the signal processor may be configured to discriminate between a swiping touch from the first element 213c to the second element 213d of button 203 or from the second element 213d to the first element 213c.

As previously discussed, the static and/or swiping touches may physically contact the surface 210a of the input device 210 near the touch sensitive elements 213a-f or the touch may not physically contact the surface 210a. In either scenario, a touch is close enough to alter the touch sensitive parameter of the touch sensitive element 213a-f, e.g., the electrical, magnetic, mechanical, optical parameter sufficiently to be discernable in the electronic waveform produced by the touch sensitive element 213a-f.

Figure 3:
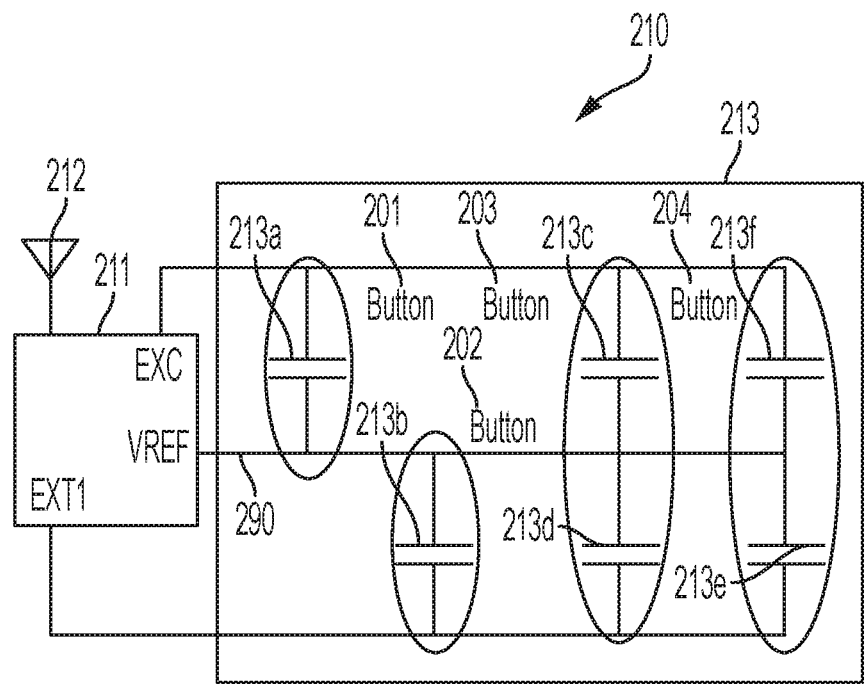
FIG. 3 provides an electrical schematic diagram of an example version of input device in accordance with some embodiments.

FIG. 3 provides an electrical schematic diagram of an example version of input device 210. Input device 210 includes a touch sensor 213 comprising buttons 201-204 with capacitive touch sensitive elements 213a-f. The reader will appreciate that many schematic configurations for the disclosed interface device are possible and this is but one implementation discussed for purposes of illustration. In this particular configuration, the touch sensitive elements 213a-f are all connected to the same output signal line 290.

In the illustrated embodiment, the touch sensitive elements 213a-f are implemented as capacitive touch sensitive elements. Each capacitive touch sensitive element 213a-f includes first and second electrical conductors, e.g., electrically conductive traces, which form the plates of the capacitor separated by an electrically non-conductive gap. The capacitance of touch sensitive element 213a is Ca; the capacitance of touch sensitive element 213b is Cb, the capacitance of touch sensitive element 213c is Cc, the capacitance of touch sensitive element 213d is Cd; the capacitance of touch sensitive element 213e is Ce; and the capacitance of touch sensitive element 213f is Cf.

In this particular example, the transponder 211 has no internal source of power and harvests energy from the excitation signal transmitted by the reader (not shown in FIG. 3) to the input device 210. Note that in other embodiments, the input device can include an on-board power source. In the illustrated embodiment, the transponder 211 uses the harvested energy to provide a sensor excitation voltage, e.g., an AC voltage (shown as EXC in FIG. 3) to the touch sensor 213. As indicated in FIG. 3, VREF is a reference voltage for the sensor excitation voltage. The output of the touch sensor 213 is connected to the transponder at EXT1. The total equivalent capacitance ($C_{SENS}$) of the sensor capacitors (213a, 213c, and 213f) is Ca+Cc+Cf, and the total capacitance ($C_{REF}$) of the reference capacitance is Cb+Cd+Ce. The output of the touch sensor at EXT1 is characterized by the equation:

$$V_{EXT1} = V_{REF} \frac{C_{REF}}{C_{REF} + C_{SENS}}$$

For any of the touch sensitive elements 213a-f, when no object is present at the touch sensitive element, any capacitive coupling at the gap stays fairly constant. When a finger (or other appropriate implement, e.g., a stylus) touches or nearly touches the touch sensitive element, the previously existing capacitive coupling is altered. The finger shunts a portion of the capacitive field whereby charge across the gap is altered. The variation in the capacitive coupling alters the current being carried in the sensor output and causes a variation in the electronic waveform at EXT1.

Figure 4:
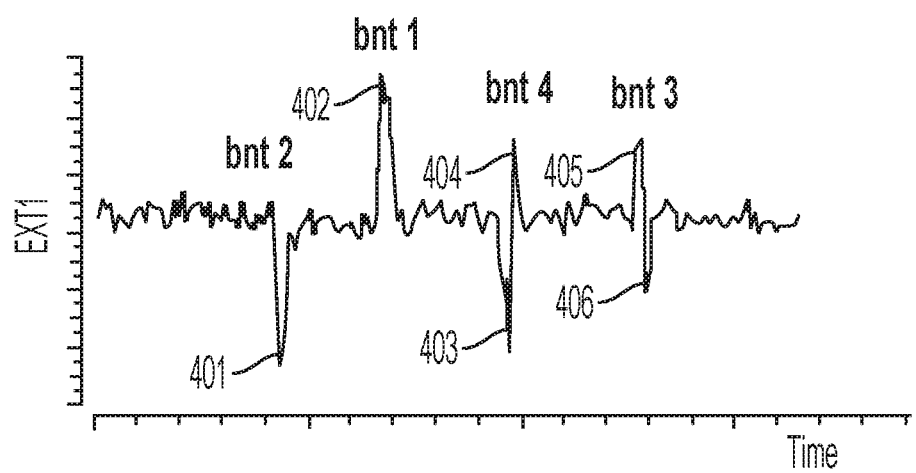
FIG. 4 shows the waveform signal amplitude of the touch sensor output when each button on the input device of FIG. 3 is activated.

FIG. 4 shows the waveform signal amplitude of the touch sensor output at EXT1 when each button on the input device 210 is activated. In this example, buttons 201-204 are activated one at a time in the following order: button 202, button 201, button 204, button 203.

A momentary touch to touch sensitive element 213b of button 202 increases the reference capacitance of Cb which in turn produces a negative going peak 401 at the touch sensor output EXT1. A momentary touch to touch sensitive element 213a of button 201 increases the sensor capacitance of Ca which in turn produces a positive going peak 402 at the touch sensor output EXT1. A swiping touch from left to right to button 204 starts with a touch at touch sensitive element 212e and moves to touch sensitive element 213f. The touch to touch sensitive element 213e causes the reference capacitance Ce to increase, producing a negative going peak 403. The negative going peak 403 is followed closely in time by a positive going peak 404 responsive to an increase in sensor Cf when touch sensitive element 213f is touched. A swiping touch from left to right to button 203 starts with a touch to touch sensitive element 213c and moves to touch sensitive element 213d. The touch at touch sensitive element 213c causes the sensor capacitance Cc to increase producing a positive going peak 405. The positive going peak 405 is followed closely in time by a negative going peak 406 responsive to an increase in reference Cd when touch sensitive element 213d is touched.

There can be various ways to construct the input sensors based on the general principle shown in FIG. 4. For example, the input device can have multiple buttons with each button comprised of different numbers of touch elements, and/or different combinations of sensor/reference capacitors. The waveforms generated by swiping over these elements will generate groups of signals with correspond combination of peaks. FIGS. 5 through 7 illustrate several of these configurations for buttons on an input device. It will be appreciated that the input devices illustrated herein are but a few examples of the many input device configurations that are possible. When activated, the touch sensitive elements of the buttons generate electronic waveforms that are incorporated into a transponder signal and transmitted to a signal processor for interpretation. The signal processor extracts the waveforms and identifies sequential multi-digit code corresponding to the button that was activated based on waveform parameters of the transponder signal. For example, the sequential multi-digit code of the activated button can be identified based on the polarity and/or timing of the peaks of the waveforms. In some embodiments, the sequential multi-digit code of the activated button can be encoded in the frequency and/or phase of the electronic waveforms.

Figure 5A:
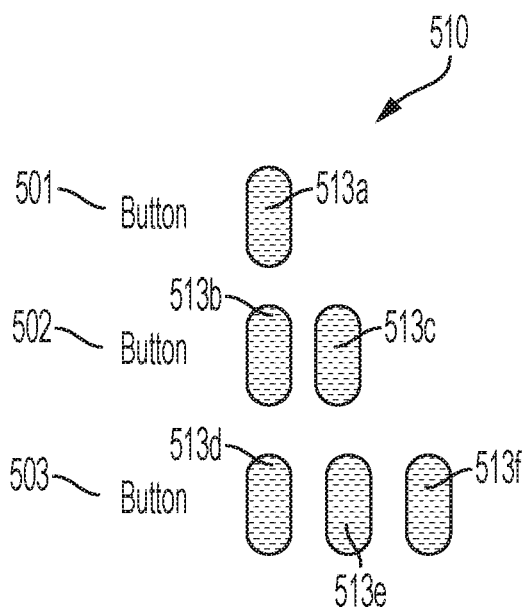
FIG. 5A illustrates an input device that includes a touch sensor having three buttons in accordance with some embodiments.
Figure 5B:
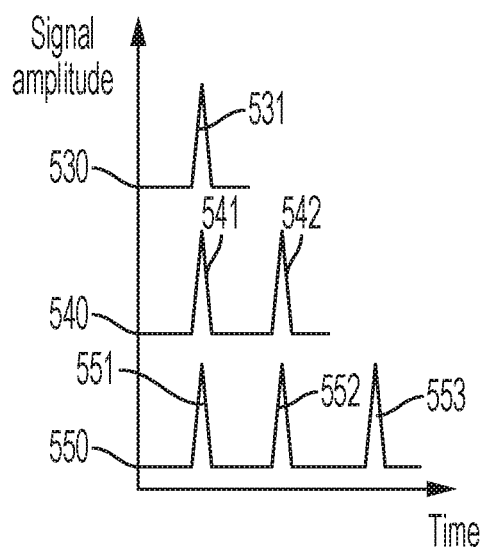
FIG. 5B provides graphs showing an idealized waveform signal at the output of the touch sensor of FIG. 5A that is generated as each button is activated by a touch.

FIG. 5A illustrates an input device 510 that includes a touch sensor having three buttons (button 501, button 502, button 503) with sensing elements connected as sensor capacitors as previously discussed. FIG. 5B provides graphs showing an idealized waveform signal that is generated at the output of the touch sensor of FIG. 5A as each button is activated by a touch. Graph 530 is the electronic waveform generated at the touch sensor output responsive to a touch to button 501; graph 540 is the electronic waveform generated at the touch sensor output responsive to a swiping touch to button 502; and graph 550 is the electronic waveform generated at the touch sensor output responsive to a swiping touch to button 503.

Button 501 includes one touch sensitive element 513a that can be activated by a static touch, generating a single peak 531. Button 502 includes two touch sensitive elements 513b, 513c that can be activated by a swiping touch, producing a waveform of two peaks 541, 542 with a short time duration (a group of waveforms means signals are sequential and close together). Button 503 includes three touch sensitive elements 513d, 513e, 513f that can be activated by a swiping touch, resulting in three peaks 551, 552, 553 grouped together. Therefore, the activated button can be identified by analyzing how many peaks are in one group of peaks. In this example, a touch on or near each touch sensitive element 513a, 513b, 513c, 513d, 513e, 513f causes a positive-going peak at the output of the touch sensor.

If one or more buttons are activated, the transponder includes the electronic waveforms generated by the button's touch sensitive elements in the transponder signal transmitted to the reader. The signal processor extracts the waveforms and identifies the button or buttons that have been touched by recognizing the pattern of the peaks that encode the multi-digit code corresponding to the touched buttons. Although this example shows only three buttons, additional buttons can be identified based on this principle.

Figure 6A:
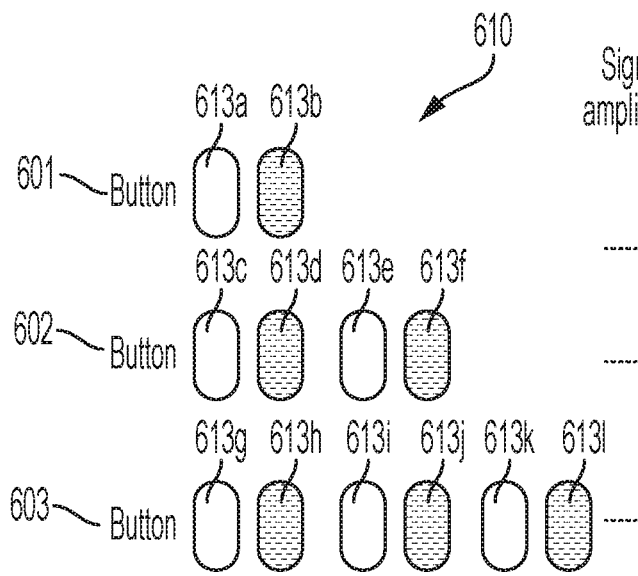
FIG. 6A illustrates an input device that includes a touch sensor having three buttons in accordance with some embodiments.

FIG. 6A illustrates an input device 610 that includes a touch sensor having three buttons. Button 601 includes two touch sensitive elements 613a, 613b that can be activated by a swiping touch. Button 602 includes four touch sensitive elements 613c, 613d, 613e, 613f that can be activated by a swiping touch. Button 603 includes six touch sensitive elements 613g, 613h, 613i, 613j, 613k, 613l that can be activated by a swiping touch. In this example, a touch on or near each touch sensitive element 613a, 613c, 613e, 613g, 613i, 613f connected as sensor capacitors causes a positive-going peak at the output of the touch sensor. A touch on or near each touch sensitive element 613b, 613d, 613f, 613h, 613j, 613l connected as reference capacitors causes a negative-going peak at the output of the touch sensor.

Figure 6B:
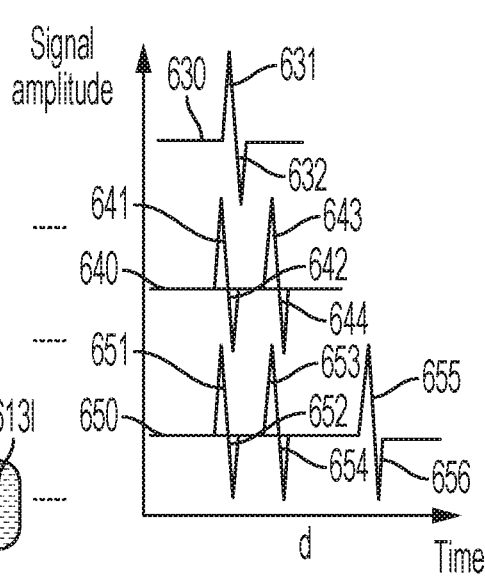
FIG. 6B provides graphs showing an idealized waveform signal generated at the output of the touch sensor of FIG. 6A as each button is activated by a touch.

FIG. 6B provides graphs showing an idealized waveform signal generated at the output of the touch sensor of FIG. 6A as each button is activated by a touch. Graph 630 is the electronic waveform generated at the touch sensor output responsive to a touch to button 601; graph 640 is the electronic waveform generated at the touch sensor output responsive to a swiping touch to button 602; and graph 650 is the electronic waveform generated at the touch sensor output responsive to a swiping touch to button 603.

As shown in FIG. 6B, a swiping touch from element 613a to 613b of button 601 generates an electronic waveform at the touch sensor output comprising a positive going peak 631 followed by a negative going peak 632 that are grouped together; a swiping touch from element 613c to 613d to 613e to 613f of button 602 generates an electronic waveform at the touch sensor output comprising a first positive-going peak 641 followed by a negative-going peak 642 followed by a positive-going peak 643 followed by a negative-going peak 644; a swiping touch across elements 613g to 613h to 613i to 613j, to 613k, to 613l of button 603 generates an electronic waveform at the touch sensor output comprising a first positive-going peak 651 followed by a negative-going peak 652 followed by a positive-going peak 653 followed by a negative-going peak 654 followed by a positive-going peak 655 followed by a negative-going peak 656. The transponder includes these electronic waveforms in the transponder signal transmitted to the reader. The signal processor extracts the waveforms and identifies the button or buttons that have been activated by recognizing the pattern of peaks associated with the buttons. A feature of this configuration is that a valid swiping touch signal is compressed with pairs of a positive peak followed by a negative peak immediately. A single peak (either positive or negative) will not be recognized as a valid signal. Therefore, noise immunity of the signal is increased.

Figure 7A:
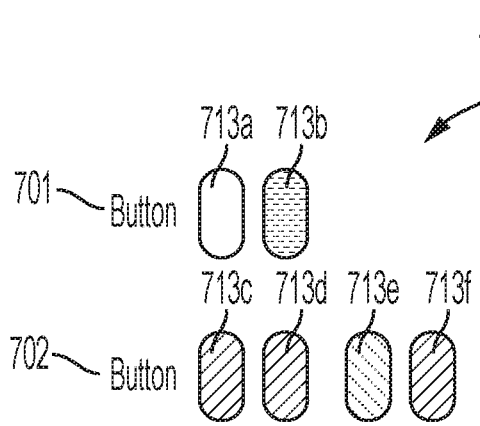
FIG. 7A illustrates an input device that includes a touch sensor having two buttons in accordance with some embodiments.

FIG. 7A illustrates an input device 710 that includes a touch sensor having two buttons. Button 701 includes two touch sensitive elements 713a, 713b that can be activated by a swiping touch. Button 702 includes four touch sensitive elements 713c, 713d, 713e, 713f that can be activated by a swiping touch.

Figure 7B:
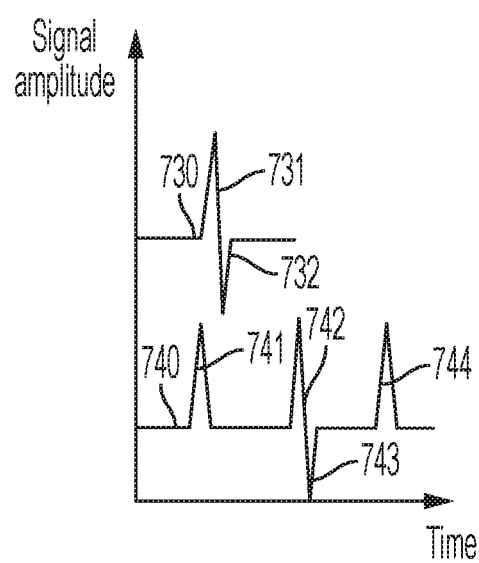
FIG. 7B provides graphs showing an idealized waveform signal generated at the output of the touch sensor of FIG. 7A as each button is activated by a touch.

FIG. 7B provides graphs showing an idealized waveform signal generated at the output of the touch sensor of FIG. 7A as each button is activated by a touch. Graph 730 is the electronic waveform generated at the touch sensor output responsive to a touch to button 701; graph 740 is the electronic waveform generated at the touch sensor output responsive to a swiping touch to button 702.

As shown in FIG. 7B, a swiping touch from element 713*a* to 713*b* of button 701 generates an electronic waveform at the touch sensor output comprising a positive going peak 731 followed by a negative going peak 732; a swiping touch from element 713*c* to 713*d* to 713*e* to 713*f* of button 702 generates an electronic waveform at the touch sensor output comprising a first positive-going peak 741 followed by a second positive-going peak 742 followed by a negative-going peak 743 followed by a positive-going peak 744. The sequence of positive and negative peaks provides a signature of a particular combination of the sensing elements to identify an activated button. The transponder includes these electronic waveforms in the transponder signal transmitted to the reader. The signal processor extracts the waveforms and identifies the button or buttons that have been activated by recognizing the pattern of peaks associated with the buttons.

FIGS. 5A through 7B illustrate scenarios in which the multi-digit code is encoded in the presence, polarity, and grouping of peaks in the transponder signal. The waveform parameters used to encode the multi-digit code can include the peak amplitude, peak width, peak polarity, and/or peak frequency or timing, for example.

Figure 8:
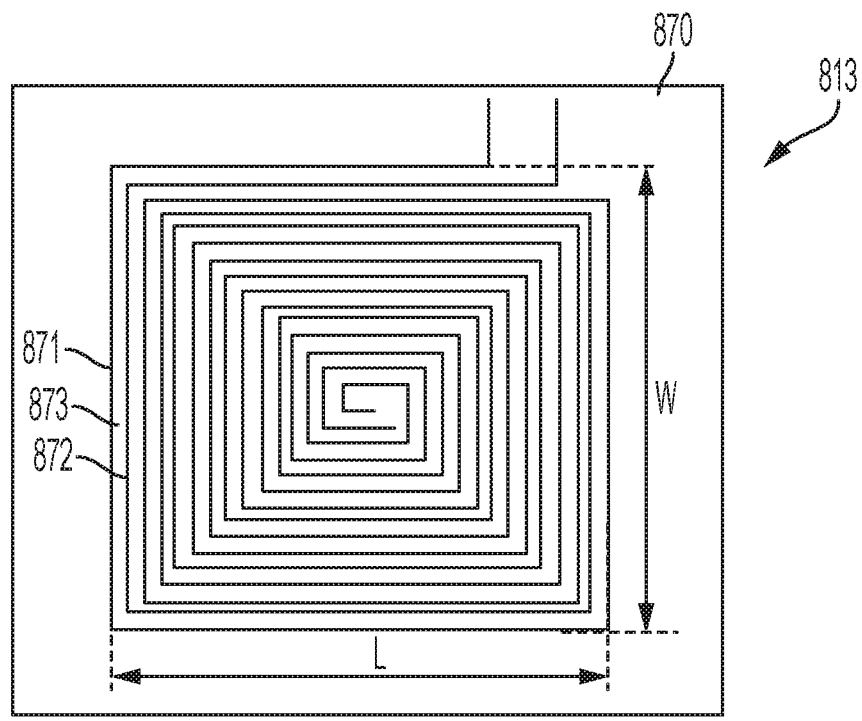
FIG. 8 is a diagram of two double wrapped planar coils that form a capacitive touch sensitive element in accordance with some embodiments.

As discussed above, the touch sensitive elements may be capacitive touch sensitive elements. As shown in FIG. 8, in some embodiments, each electrical conductor 871, 872 of a capacitive touch sensitive element 813 may be a planar coil. The two coils 871, 872 of the touch sensitive element can be a double wrapped and electrically isolated from one another by a gap 873*a* as shown in FIG. 8. In some embodiments, the electrical conductors 871, 872 are implemented as conductive traces printed onto a substrate 870. Additional details of double wrapped coils used for touch sensing are discussed in commonly owned U.S. Pat. No. 9,874,984 which is incorporated herein by reference.

The gap 873 between the double wrapped coils 871, 872 can be about 3 µm to about 1 mm, e.g., about 90 µm, for example. The double wrapped coils 871, 872 can be approximately circular in shape, can be or rectangular in shape as illustrated in FIG. 8, or can have any other suitable shape. For circular-shaped coils, the diameter of each coil can range from about 50 µm to about 20 mm depending on the application. For rectangular shaped planar coils, the length, L, and width, W, of the rectangle can range between about 50 µm to about 20 mm depending on the application. The overall length of the coil conductors depends on the design of the gap, shape, and size of the coil. In some embodiments, the total diameter (or the length and width) of the double-wrapped coils may be about 3.4 mm and the total length of the gap may be about 426 mm (2 times the length of a coil).

Figure 9:
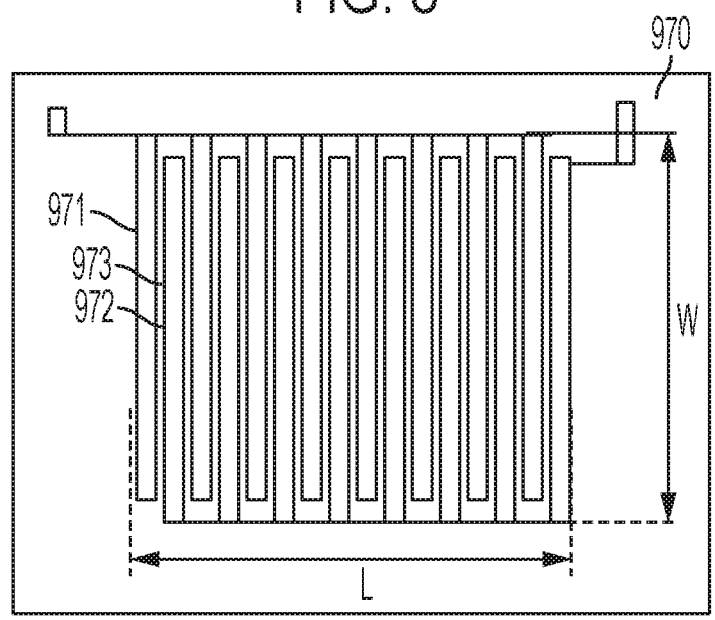
FIG. 9 is a diagram of interdigitated electrodes that form a capacitive touch sensitive element in accordance with some embodiments.

As shown in FIG. 9, in some embodiments, the electrical conductors 971, 972 of a capacitive touch sensitive element 913 may be co-planar interdigitated electrodes. The two interdigitated electrodes 971, 972 of the touch sensitive element are electrically isolated from one another by a gap 973 as shown in FIG. 9. In some embodiments, the electrical conductors 971*b*, 972*b* are implemented as conductive traces printed onto a substrate 970.

The gap 973 between the interdigitated electrodes 971, 972 can be about 3 µm to about 1 mm, e.g., about 90 µm, for example. The interdigitated electrodes 971, 972 can be approximately rectangular in shape as illustrated in FIG. 9, or can have any other suitable shape. The length, L, and width, W, of the rectangle formed by the interdigitated electrodes can range between about 50 µm to about 20 mm depending on the application. The overall length of each conductor depends on the design of the gap, shape, and size of the coil. In some embodiments, the total length of the gap between the interdigitated electrodes 971, 972 is about the number of the electrodes times the width, W.

The double-wrapped coils or interdigitated electrodes as illustrated in FIGS. 8 and 9 form a co-planar capacitor with a long gap between two neighboring conductors. The geometry provides a large capacitance change when an object touches or nearly touches the surface of the input device. The large capacitance change yields efficient sensing and enhances signal/noise (S/N) ratio.

In various embodiments, a capacitive sensor comprising double wrapped coils or interdigitated electrodes can be patterned on a printable substrate. Techniques for patterning the conductive traces include, for example, inkjet printing, gravure printing, screen-printing, aerosol printing, and/or photolithography, among other patterning technologies. The printable substrate may be flexible or rigid. The printable substrate can include a polymeric material, such a polyethylene naphthalate (PEN), polyethylene terephthalate (PET), polymide, etc. In some embodiments the substrate may comprise paper, or woven or non-woven fabrics, for example. The material of the traces that form the coils or electrodes may be a flexible electrically conductive material. The flexible conductive material of the coils or electrodes may include silver, gold, copper, or conductive carbon, among others.

In some embodiments, a first conductor of the capacitive touch sensing element, e.g., coil or electrode is deposited, e.g., printed, on a substrate and a second conductor of the capacitive touch sensitive element is deposited, e.g. printed, on the same substrate but without touching the first coil. In alternative embodiments, the first conductor of the capacitive touch sensing element is deposited, e.g., by printing, on a first substrate and a second conductor of the capacitive touch sensitive element is deposited on a different second substrate. In further alternative embodiments, the first conductor of the capacitive touch sensing element and second conductor of the capacitive touch sensing element are deposited sequentially; simultaneously; parts of the two conductors are printed and then the rest of the conductor parts are printed; or by any other useful printing order.

Figure 10A:
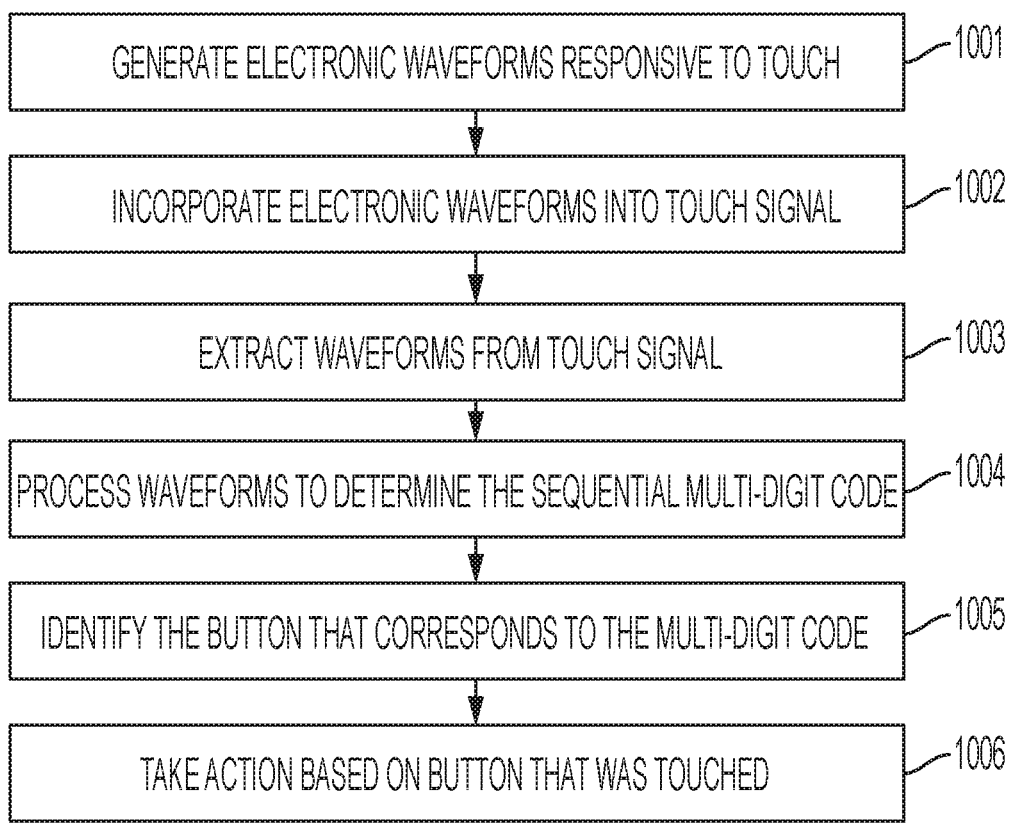
FIG. 10A is a flow diagram of a process of operating an interface in accordance with some embodiments.

FIG. 10A is a flow diagram of a process of operating an interface in accordance with some embodiments. The method includes generating 1001 electronic waveforms in response to a touch on or near touch sensitive elements of input device of the interface. The electronic waveforms represent a sequential multi-digit code and are incorporated 1002 in a touch input signal. The electronic waveforms are extracted 1003 from the touch signal. The sequential multi-digit code is determined 1004 based on the sequence of electronic waveforms in the touch signal. The button that corresponds to the sequential multi-digit code is identified 1005. The system takes action 1006, e.g., displays information, makes a sound, etc., based on which button was touched.

Figure 10B:
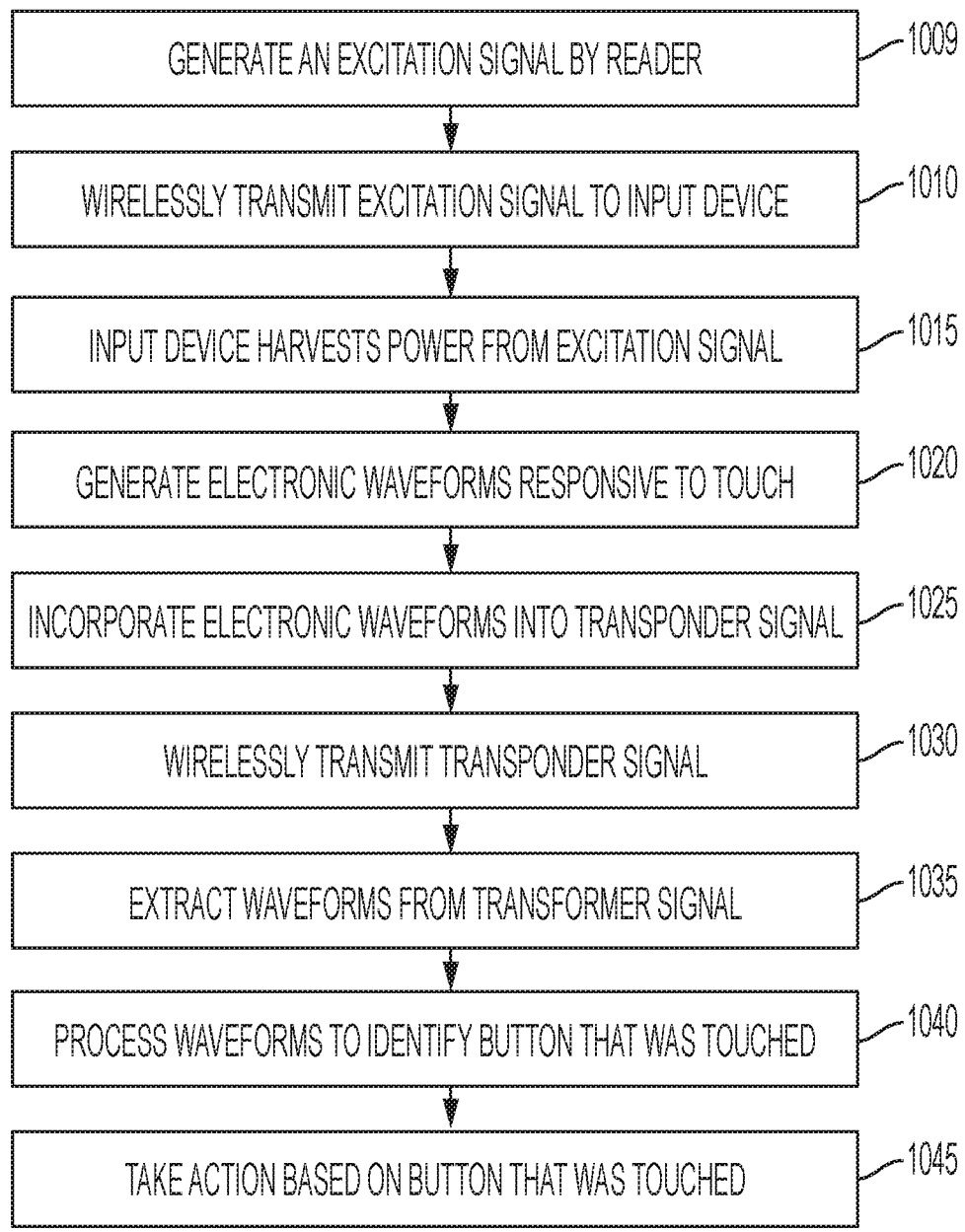
FIG. 10B is a flow diagram of a process of operating an interface in accordance with some embodiments.

FIG. 10B is a flow diagram of a process of operating an interface in accordance with some embodiments. The method includes generating 1009 an excitation signal and wirelessly transmitting 1010 the excitation signal to an input device that does not include an internal source of power. The input device receives the excitation signal and harvests power 1015 from the excitation signal to provide power to operate the input device. When a touch occurs at or proximate to a touch sensing element of the input device, electronic waveforms are generated 1020 in response. The transponder incorporates 1025 electronic waveforms into the transponder signal and wirelessly transmits 1030 the transponder signal back to the reader. The reader receives the transponder signal. The reader may include a signal processor that extracts 1035 electronic waveforms from the transponder signal and interprets 1040 the waveforms to determine which button (group of touch sensing elements) was touched. Alternatively, the reader may transfer the transponder signal to an accessory device that includes the signal processor. The system takes action 1045, e.g., displays information, makes a sound, etc., based on which button was touched.

The signal processor determines which button (group of one or more touch sensing elements) was touched and/or the order in which the buttons were touched based on the signal characteristics of the electronic waveforms. For example, the signal processor may examine characteristics such as the polarity of the peaks, the timing between the peaks, and/or the peak widths of the electronic waveform to discriminate between touch events. For example one or more buttons touched successively with a static touch may involve a time interval between peaks greater than a predetermined value, tmin. Recognition of a touch to a button arranged to accept a swiping touch may involve determining if intervals between peaks associated with the swiping touch are less than a predetermined value, tmax.

According to some embodiments, the sequential multi-digit code may be encoded in the timing between the peaks of electronic waveforms in a touch signal. For example, the timing between the peaks can be related to the distance between touch sensitive elements of the buttons. As another example, recognition of a touch to a button arranged to accept a static touch may involve determining if a peak width, e.g., full peak width at half maximum (FWHM) associated with the static touch is greater than a predetermined value, tpmin. Recognition of a touch to a button arranged to accept a swiping touch may involve determining if peak widths associated with the swiping touch are less than a predetermined value, tpmax. In yet other embodiments, the multi-digit code may be encoded in the number of peaks, the frequency of the peaks, the polarity of the peaks and/or the amplitude of the peaks as illustrated in the examples below.

Figure 11A:
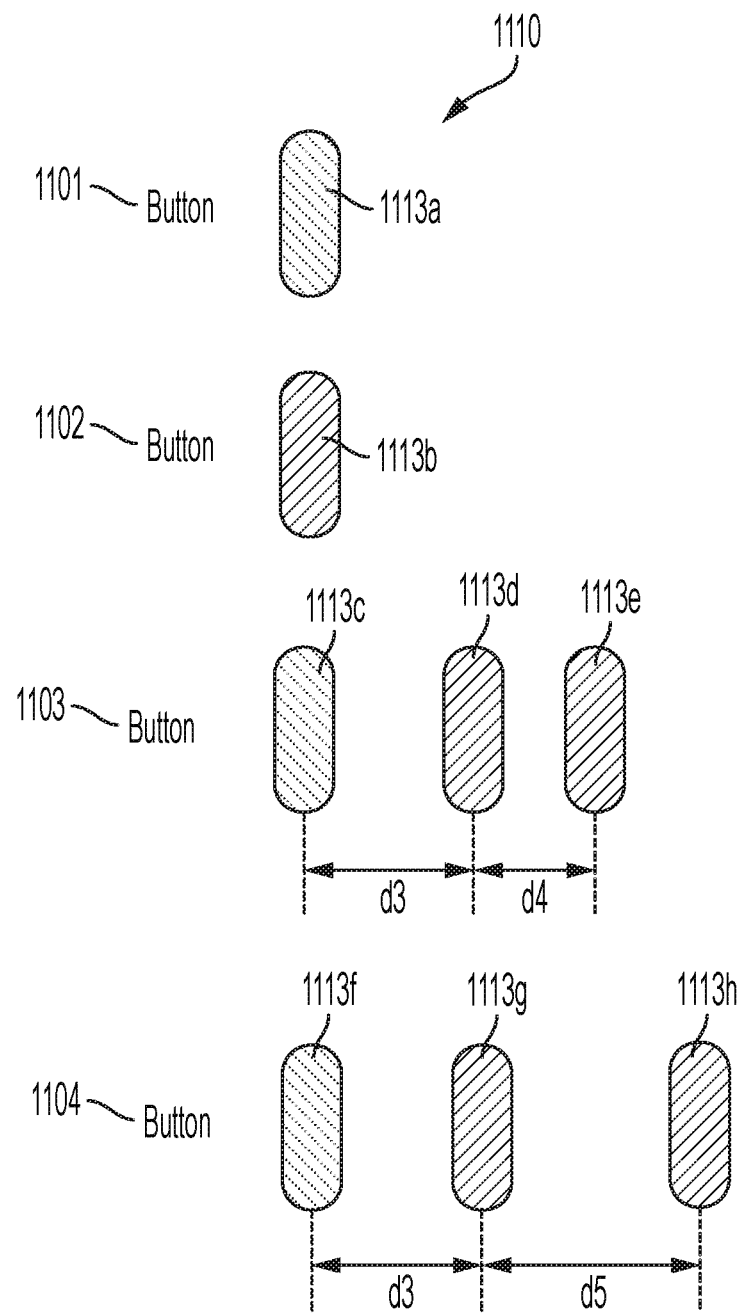
FIG. 11A shows an input device in accordance with some embodiments.
Figure 11B:
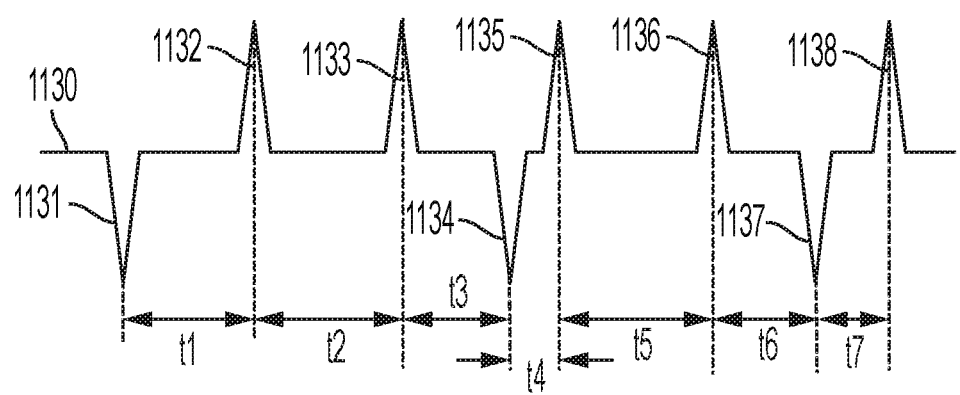
FIG. 11B provides graphs showing an idealized waveform signal generated at the output of the touch sensor of FIG. 11A as each button is activated by a touch.

FIGS. 11A and 11B illustrate multi-digit codes encoded in timing of the peaks. FIG. 11A shows an input device 1110 having button 1101, button 1102, button 1103, and button 1104. Buttons 1101 and 1102 each include one touch sensitive element 1113a, 1113b arranged to accept a static touch. The capacitive sensors are connected such that a touch on or near Button 1101 produces a negative-going peak. A touch on or near Button 1102 produces a positive-going peak. Button 1103 includes touch sensitive elements 1113c, 1113d, 1113e arranged to accept a swiping touch. A swiping touch from element 1113c to element 1113d to element 1113e produces a sequence comprising a positive-going peak followed by a negative-going peak followed by a positive going peak. Button 1104 includes touch sensitive elements 1113f, 1113g, 1113h arranged to accept a swiping touch. A swiping touch from element 1113f to element 1113g to element 1113h produces a sequence comprising a positive-going peak followed by a negative-going peak followed by a positive going peak. The multi-digit code representing Button 1103 differs from the multi-digit code representing Button 1104 due to the timing (of frequency) of the peaks.

FIG. 11B provides a graph showing an idealized waveform signal generated at the output of the touch sensor of FIG. 11A as each button is activated by a touch in the order: button 1101, button 1102, button 1103, button 1104. A static touch to Button 1101 followed by a static touch to Button 1102 generates a negative-going peak 1131 followed by a positive-going peak 1132 with a time interval t1 between the negative-going peak 1131 and the positive-going peak 1132. A swiping touch to Button 1103 generates a positive-going peak 1133 followed by a negative-going peak 1134 followed by a positive going peak 1135. There is a time interval t2 between peak 1132 and peak 1133, a time interval t3 between peak 1133 and 1134, a time interval t4 between peak 1134 and 1135. A swiping touch to Button 1104 generates a positive-going peak 1133 followed by a negative-going peak 1137 followed by a positive going peak 1138. There is a time interval t5 between peak 1135 and peak 1136, a time interval t6 between peak 1136 and 1137, a time interval t7 between peak 1137 and 1138.

In this particular example, the signal processor uses the polarities of the peaks and the time intervals between peaks to discern touch events. A time interval between peaks greater than tmin indicates the start of a touch to a button. Thus, time intervals t1, t2, and t5 greater than tmin indicate the start of a new button. Based on the presence and polarity of peaks 1131 and 1132 and the time intervals t1 and t2 greater than the predetermined time tmin, the signal processor interprets this portion of the electronic waveform 1130 to represent a static touch to button 1101 followed by a static touch to button 1102. The time interval t2 between peaks 1132 and 1133 is greater than tmin indicating that a new button is being touched when peak 1133 is detected. The time interval t3 between negative-going peak 1133 and positive-going peak 1134 and the time interval t4 between peaks 1134 and 1135 are less than tmax indicating a swiping touch to button 1103. The time interval t5 between peaks 1135 and 1136 is greater than tmin indicating that a new button is being touched when peak 1136 is detected. The time interval t6 between peak 1136 and peak 1137 and the time interval t7 between peaks 1137 and 1138 are less than tmax indicating a swiping touch to button 1104.

In this embodiment, the polarity pattern of the peaks generated by buttons 1103 and 1104 is the same: a positive-going peak 1133, 1136 followed by a negative-going peak 1134, 1137 followed by a positive-going peak 135, 1138. The signal processor is able to discriminate between button 1103 and button 1104 based on the difference between time t4 and t7. Peak times t4 and t7 are related to the distances d4 and d7, respectively, wherein d4 is the center-to-center distance between touch sensitive elements 1113d and 1113e of button 1103 and d7 is the center-to-center distance between touch sensitive elements 1113g and 1113h of button 1104. Note that the distance d3 between touch sensitive elements 1113c and 1113d and between touch sensitive elements 1113f and 1113g may be the same. A swipe across touch sensitive elements 1113c and 1113d or touch sensitive elements 1113f and 1113g may be used to determine the speed of the swipe. The speed of the swipe may be used to determine the expected times t4 and t7 and thus to discriminate between button 1103 and button 1104.

Figures 12A, 12B:
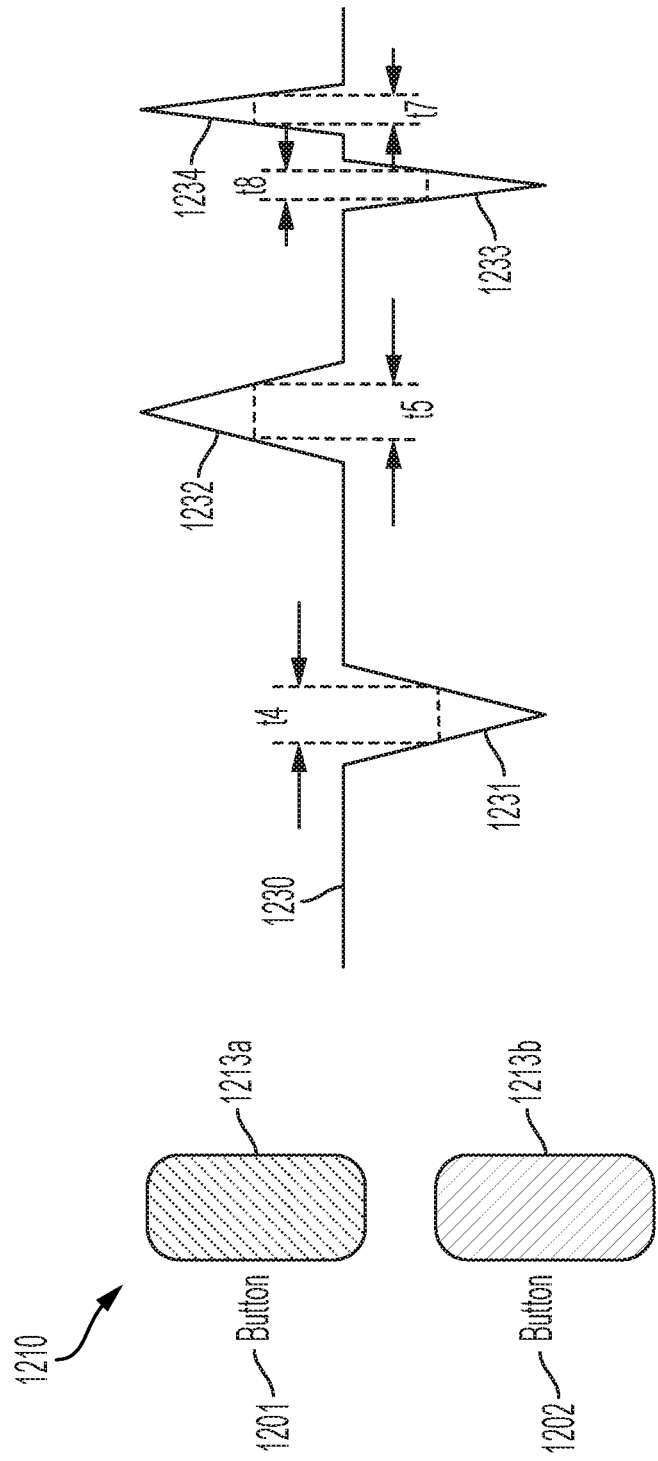
FIG. 12A shows an input device in accordance with some embodiments.
FIG. 12B provides graphs showing an idealized waveform signal generated at the output of the touch sensor of FIG. 12A as each button is activated by a touch.

FIGS. 12A and 12B illustrate multi-digit codes encoded in widths of the peaks. FIG. 12A shows an input device 1210 having button 1201, button 1203, and button 1203. Buttons 1201 and 1202 each include one touch sensitive element 1213a, 1213b arranged to accept a static touch. Button 1203 includes touch sensitive elements 1213c, 1213d arranged to accept a swiping touch.

FIG. 12B depicts idealized waveforms 1230 that would result if the buttons are touched in the order: button 1201, button 1202, button 1203. In this particular example, the signal processor uses the polarities of the peaks and the FWHM peak widths of the peaks to discern touch events. A static touch to button 1201 followed by a static touch to button 1202 generates a negative-going peak 1231 followed by a positive-going peak 1232. Since touch sensitive element 1213a, 1213b is wider than 1213c and 1213d, static touches have a wider peak width than swiping touches. The FWHM peak widths Δt4, Δt5 of peaks 1231, 1232 are greater than a predetermined minimum value tpmin and are interpreted as two separate static touches to buttons 16 and 17 in this example. A swiping touch to button 1203 generates a negative-going peak 1233 followed by a positive-going peak 1234. The FWHM peak widths Δt6, Δt7 of peaks 1233, 1234 are less than a predetermined value tpmax and peaks 1233, 1234 are interpreted as a swiping touch to button 1203.

Figure 13A:
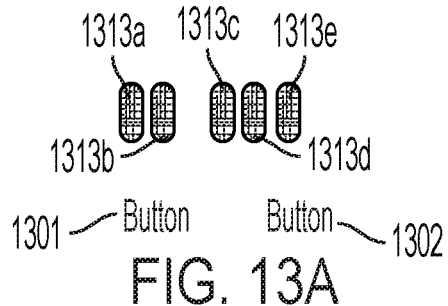
FIG. 13A shows an input device in accordance with some embodiments.
Figure 13B:
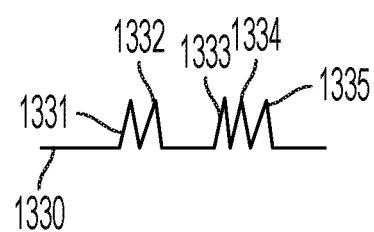
FIG. 13B provides graphs showing an idealized waveform signal generated at the output of the touch sensor of FIG. 13A as each button is activated by a touch.

FIGS. 13A and 13B illustrate an input device having touch sensitive elements 1313a-e configured such that multi-digit codes are encoded in the number of the peaks of the touch response signal. FIG. 13A shows an input device having buttons 1301 and 1302. Button 1301 includes touch sensitive elements 1313a and 1313b arranged to respond to a swiping touch. Button 1302 includes touch sensitive elements 1313c, 1313d, 1313e arrange to respond to a swiping touch.

FIG. 13B depicts idealized waveforms in a touch response signal 1330 that would result if the buttons are touched in the order: Button 1301, Button 1302. In this particular example, the signal processor uses the number of peaks to discern touch events to different buttons. A swiping touch to button 1301 generates two positive-going peaks 1331, 1332. A swiping touch to Button 1302 generates three positive-going peaks 1333, 1334, 1335. In this embodiment, if two peaks are detected, the signal processor determines that Button 1301 has been activated. If three peaks are detected, the signal processor determines that Button 1302 has been activated.

Figure 14A:
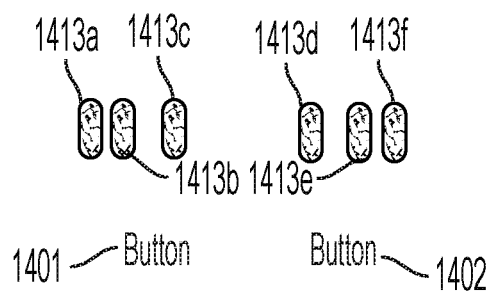
FIG. 14A shows an input device in accordance with some embodiments.
Figure 14B:
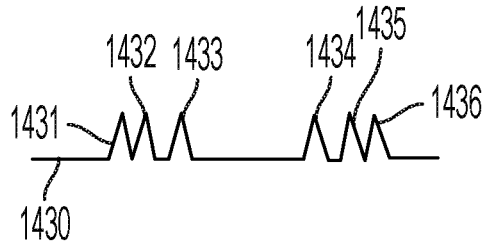
FIG. 14B provides graphs showing an idealized waveform signal generated at the output of the touch sensor of FIG. 14A as each button is activated by a touch.

FIGS. 14A and 14B illustrate an input device having touch sensitive elements 1413a-f configured such that multi-digit codes are encoded in the frequency (or timing) of peaks of the touch response signal. FIG. 14A shows an input device having buttons 1401 and 1402. Button 1401 includes touch sensitive elements 1413a, 1413b, 1413c arranged to respond to a swiping touch. Button 1402 includes touch sensitive elements 1413d, 1413e, 1413f arranged to respond to a swiping touch.

FIG. 14B depicts idealized waveforms in the touch response signal 1430 that would result if the buttons are touched in the order: Button 1401, Button 1402. In this particular example, the signal processor uses the frequency (or timing) of the peaks to discern touch events to different buttons. A swiping touch to button 1401 generates two three positive-going peaks 1431, 1432, 1433, wherein leading peaks 1431 and 1432 occur at a relatively higher frequency. A swiping touch to Button 1402 generates three positive-going peaks 1434, 1435, 1436 wherein trailing peaks 1435 and 1436 occur at relatively higher frequency. In this embodiment, if leading peaks are detected at higher frequency, the signal processor determines that Button 1401 has been activated. If trailing peaks are detected at higher frequency, the signal processor determines that Button 1402 has been activated.

Figure 15A:
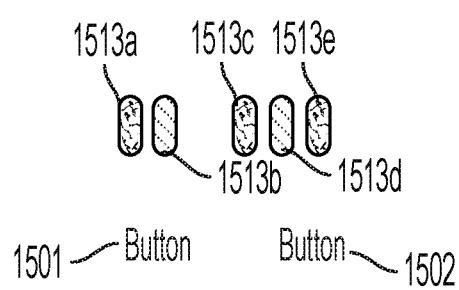
FIG. 15A shows an input device in accordance with some embodiments.
Figure 15B:
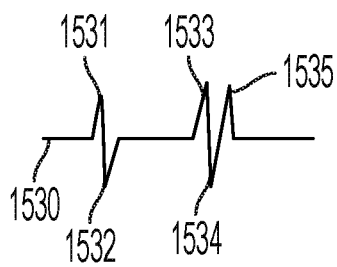
FIG. 15B provides graphs showing an idealized waveform signal generated at the output of the touch sensor of FIG. 15A as each button is activated by a touch.

FIGS. 15A and 15B illustrate an input device having touch sensitive elements 1513a-e configured such that multi-digit codes are encoded in the number and polarity of the peaks in the touch response signal. FIG. 15A shows an input device having buttons 1501 and 1502. Button 1501 includes touch sensitive elements 1513a and 1513b arranged to respond to a swiping touch. Touch sensitive element 1513a is configured to produce a positive-going pulse in response to a touch and touch sensitive element 1513b is configured to produce a negative-going pulse in response to a touch. Button 1502 includes touch sensitive elements 1513c, 1513d, 1513e arranged to respond to a swiping touch. Touch sensitive element 1513c is configured to produce a positive-going pulse in response to a touch, touch sensitive element 1513d is configured to produce a negative-going pulse in response to a touch, and touch sensitive element 1513e is configured to produce a positive-going pulse in response to a touch.

FIG. 15B depicts idealized waveforms in a touch response signal 1530 that would result if the buttons are touched in the order: Button 1501, Button 1502. In this particular example, the signal processor uses the number and polarity of the peaks to discern touch events to different buttons. A swiping touch to button 1501 generates a positive-going peak 1531 followed by a negative-going peak 1532. A swiping touch to Button 1502 generates a positive-going peak 1533 followed by a negative going peak 1534 followed by a positive-going peak 1535. In this embodiment, if a positive-going peak followed by a negative-going peak is detected, the signal processor determines that Button 1501 has been activated. If a positive-going peak followed by a negative going peak followed by a positive-going peak is detected, the signal processor determines that Button 1502 has been activated.

Figure 16A:
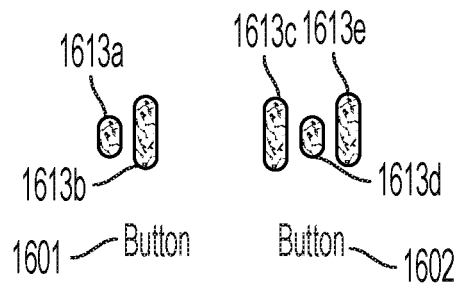
FIG. 16A shows an input device in accordance with some embodiments.
Figure 16B:
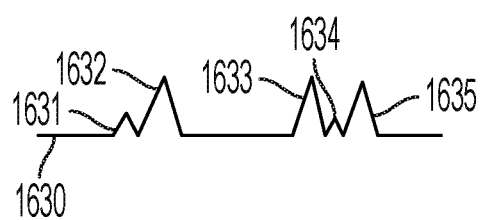
FIG. 16B provides graphs showing an idealized waveform signal generated at the output of the touch sensor of FIG. 16A as each button is activated by a touch.

FIGS. 16A and 16B illustrate an input device having touch sensitive elements 1513a-e configured such that multi-digit codes are encoded in the amplitude and number of the peaks in the touch response signal. FIG. 16A shows an input device having buttons 1601 and 1602. Button 1501 includes touch sensitive elements 1613a and 1613b arranged to respond to a swiping touch. Touch sensitive element 1613a is configured to produce a relatively lower amplitude peak in response to a touch and touch sensitive element 1613b is configured to produce relatively higher amplitude peak in response to a touch. Button 1602 includes touch sensitive elements 1613c, 1613d, 1613e arranged to respond to a swiping touch. Touch sensitive element 1613c is configured to produce a relatively higher amplitude peak in response to a touch, touch sensitive element 1613d is configured to produce a relatively lower amplitude peak in response to a touch, and touch sensitive element 1613e is configured to produce a relatively higher amplitude peak in response to a touch.

FIG. 16B depicts idealized waveforms in a touch response signal 1630 that would result if the buttons are touched in the order: Button 1601, Button 1602. In this particular example, the signal processor uses the number and amplitude of the peaks to discern touch events to different buttons. A swiping touch to button 1601 generates a relatively lower amplitude peak 1631 followed by a relatively higher amplitude peak 1632. A swiping touch to Button 1602 generates a relatively higher amplitude peak 1633 followed by a relatively lower amplitude peak 1634 followed by a relatively higher amplitude peak 1635. In this embodiment, if a relatively lower amplitude peak followed by a relatively higher amplitude peak is detected, the signal processor determines that Button 1601 has been activated. If a relatively higher amplitude peak followed by a relatively lower amplitude peak followed by a relatively higher amplitude peak is detected, the signal processor determines that Button 1602 has been activated.

Figure 17A:
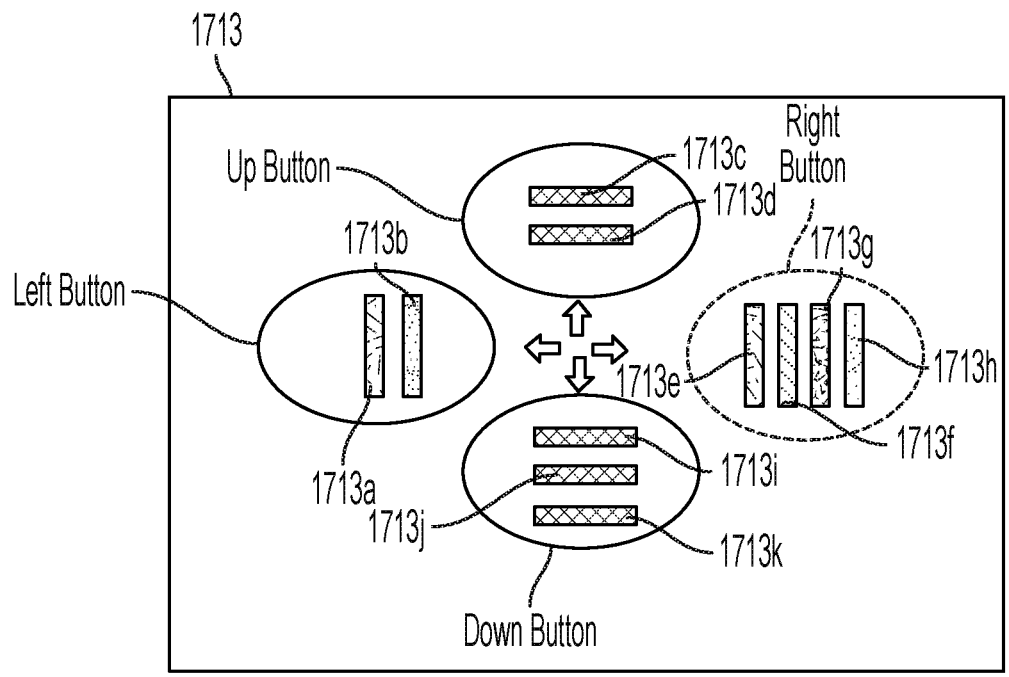
FIG. 17A shows an input device having directional buttons in accordance with some embodiments.

According to some embodiments, the direction of a swiping touch can be encoded in sequential multi-digit codes represented in electronic waveforms of the touch response signal produced by the touch sensitive elements. FIG. 17A depicts a touch sensor 1713 having touch sensitive elements 1713*a-k*. Touch sensitive elements 1713*a*, 1713*b* are grouped as the left button; touch sensitive elements 1713*c*, 1713*d* are grouped as the up button; touch sensitive elements 1713*e*, 1713*f*, 1713*g*, 1713*h* are grouped as the right button; and touch sensitive elements 1713*i*, 1713*j*, 1713*k* are grouped as the down button. The direction of the swipe is encoded in the number and polarity of the peaks in the touch response signal.

Figure 17B:
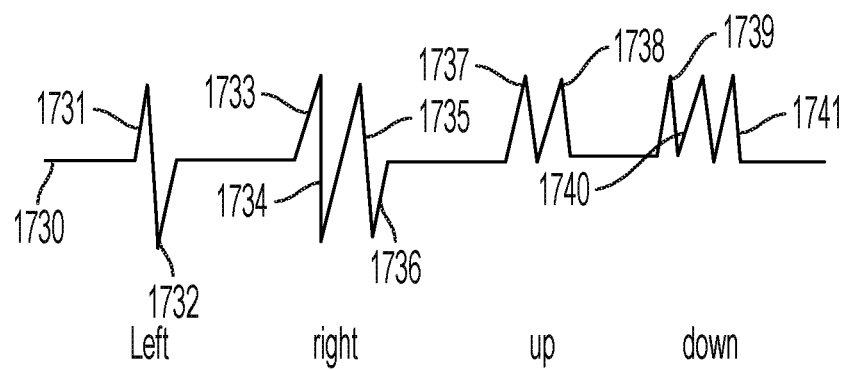
FIG. 17B provides graphs showing an idealized waveform signal generated at the output of the touch sensor of FIG. 17A as each button is activated by a touch.

FIG. 17B depicts idealized waveforms in a touch response signal 1730 that would result if the buttons are touched in the order: Left, Right, Up, Down. In this particular example, the signal processor uses the number and polarity of the peaks to discern touch events to different buttons. A swiping touch to the left button generates a positive-going peak 1731 followed by a negative-going peak 1732. A swiping touch to the right button generates a positive-going peak 1733 followed by a negative-going peak 1734 followed by a positive-going peak 1735 followed by a negative-going peak 1736. A swiping touch to the up button generates a positive-going peak 1737 followed by another positive-going peak 1738. A swiping touch to the down button generates three positive-going peaks 1739, 1740, 1741. In this embodiment, if a positive-going peak followed by a negative-going peak is detected, the signal processor determines that left button has been activated. If a positive-going peak followed by a negative-going peak followed by a positive-going peak followed by a negative-going peak is detected, the signal processor determines that right button has been activated. If two positive-going peaks are detected, the signal processor determines that the up button has been activated. If three positive-going peaks are detected, the signal processor determines that the down button has been activated.

Figure 18:
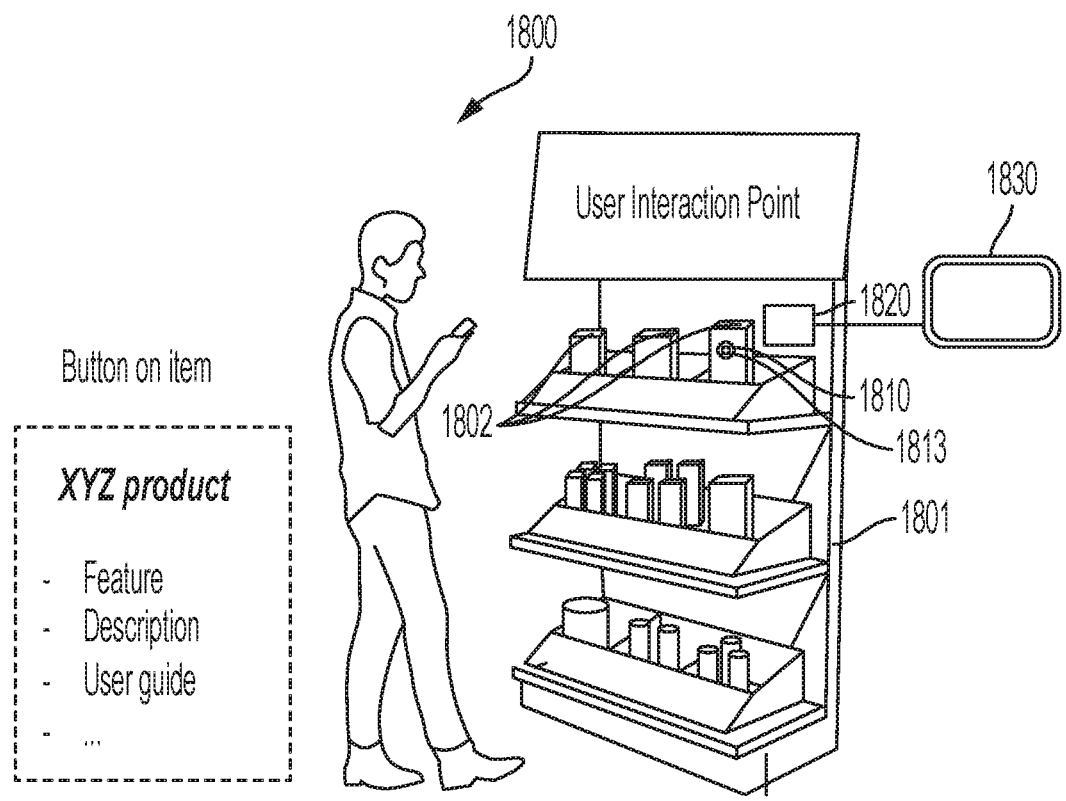
FIG. 18 provides an example of an interactive system that incorporates a user interface in accordance with some embodiments.

FIG. 18 provides an example of an interactive system 1800 that incorporates a user interface in accordance with some embodiments. A user approaches a shelf 1801 of products 1802 for sale in a market. Each of the products 1802 includes an input device 1810 comprising a touch sensor 1813 with buttons having one or more touch sensitive elements as discussed. The touch sensitive elements of the touch sensor 1813 are printed on the product's label. The user can pick up a product 1802 and touch or swipe the buttons printed on the label. The input device 1810 on the label is interrogated by a reader 1820 which may be located on the shelf 1801 holding the products or elsewhere. Depending on the buttons that were touched or swiped, an output device 1830 coupled to the reader displays information about the product 1802 to the user. In some implementations, the output device 1830 may be a cellular phone running a software application that performs the signal processing to identify the button or that receives the identification of the butting from the reader 1820.

Figure 19:
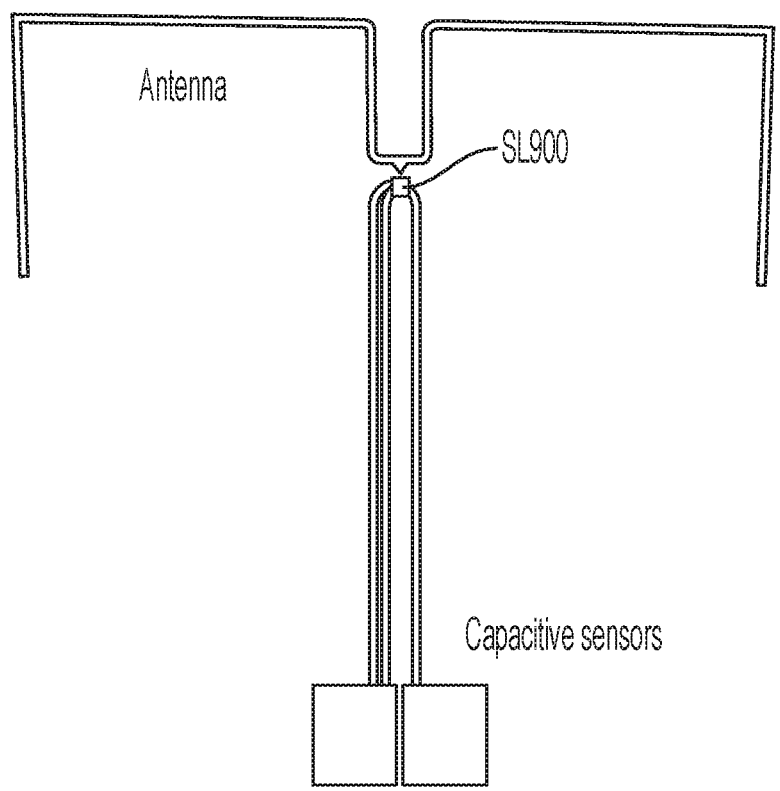
FIG. 19 is a photograph of a prototype version of the input device in accordance with some embodiments.

FIG. 19 is a photograph of a prototype version of the input device that was fabricated in which the electrical traces of the antenna and capacitive touch sensitive elements were formed by silver ink extrusion on a polyethylene naphthalate substrate. The antenna and touch sensitive elements were connected to a transponder comprising the SL900a RFID chip available from AMS AG Tobelbader Strasse 30 8141 Premstaetten Austria. There are two capacitive touch sensitive elements, one as sensor capacitor (left) and the other as reference capacitor (on the right). Touching on the left or right element produces a positive or negative signal peak respectively. Swiping both elements from left to right or right to left causes a pair of positive/negative or negative/positive signals. Therefore, the prototype has four equivalent input "buttons".

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated. It should also be understood that all U.S. patents, patent applications, patent application publications, and other patent and non-patent documents referred to herein are incorporated by reference, to the extent they do not contradict the foregoing disclosure.

The invention claimed is:

1. An interface system comprising:
   at least one input device comprising:
      one or more groups that include two or more touch sensitive elements, each group of two or more touch sensitive elements arranged to generate a sequence of electronic waveforms corresponding to a sequential multi-digit code that identifies the group in response to a swiping touch across the two or more touch sensitive elements;
      a transponder electrically connected to the touch sensitive elements, the transponder configured to receive an excitation signal and to transmit a response signal that represents the sequence of electronic waveforms to a reader;
   the reader comprising:
      a signal generator configured to generate the excitation signal; and
      a receiver configured to receive the response signal;
   a signal processor configured to extract the code from the response signal; and
   an output device configured to generate an output responsive to the code, wherein the sequential multi-digit code is one of:
      encoded in peaks in the electronic waveforms generated in response to the swiping touch;
      encoded in timing between waveform features of the electronic waveforms generated in response to the swiping touch;
      encoded in a frequency of the electronic waveforms generated in response to the swiping touch; or
      encoded in a phase of the electronic waveforms generated in response to the swiping touch.

2. The system of claim 1, wherein the excitation signal wirelessly powers the at least one input device.

3. The system of claim 1, wherein at least one of the touch sensitive elements is a capacitive touch sensor.

4. The system of claim 3, wherein the capacitive touch sensitive element comprises two interdigitated electrodes or two double wrapped coils.

5. The system of claim 1, wherein at least one of the touch sensitive elements is a pressure sensor, an optical sensor, an acoustic sensor or a magnetic sensor.

6. The system of claim 1, wherein at least one of the touch sensitive elements is a first type of sensor and at least another one of the touch sensitive elements is a second type of sensor.

7. The system of claim 1, wherein the signal processor is configured to recognize direction of the swiping touch based on the response signal.

8. The system of claim 1, wherein the signal processor is configured to recognize speed of the swiping touch based on the response signal.

9. The system of claim 1, wherein the at least one input device includes at least one group that includes only one touch sensitive element.

10. An interface system comprising:
   at least one input device comprising:
      one or more groups that include two or more touch sensitive elements, each group of two or more touch sensitive elements arranged to generate a sequence of electronic waveforms corresponding to a sequential multi-digit code that identifies the group in response to a swiping touch across the two or more touch sensitive elements;
      a transponder electrically connected to the touch sensitive elements, the transponder configured to receive an excitation signal and to transmit a response signal that represents the sequence of electronic waveforms to a reader;
   the reader comprising:
      a signal generator configured to generate the excitation signal; and
      a receiver configured to receive the response signal;
   a signal processor configured to extract the code from the response signal; and
   an output device configured to generate an output responsive to the code, wherein:
      the reader is disposed on product shelving; and
      the at least one input device comprises multiple input devices, each input device respectively disposed on a product displayed on the shelving.

11. The system of claim 10, wherein:
   the signal processor is configured to identify the group of touch sensitive elements activated by the swiping touch based on the code; and
   the output device is configured to provide information about the product based on identifying the group of activated touch sensitive elements.

12. A method comprising:
   activating at least one group of touch sensitive elements of an input device by a swiping touch on or near the touch sensitive elements;
   generating, by the input device, a sequence of electronic waveforms corresponding to a multi-digit code in response to activating the at least one group of touch sensitive elements by the swiping touch;
   transmitting, by the input device, a response signal representing the sequence electronic waveforms to a reader;
   extracting the code;
   generating an output in response to the code; and
   determining the sequential multi-digit code based on one of:
      timing between waveform features of the electronic waveforms represented in the response signal;
      frequency of the electronic waveforms represented in the response signal;
      phase of the electronic waveforms represented in the response signal; or
      peaks in the electronic waveforms generated in response to the swiping touch.

13. The method of claim 12, further comprising generating an excitation signal.

14. The method of claim 13, wherein the excitation signal is an electromagnetic signal that remotely powers the input device.

15. The method of claim 13, wherein the excitation signal is an optical signal.

16. The method of claim 12 wherein transmitting the response signal comprises transmitting the response signal over a wireless communication link.

17. The method of claim 12 wherein transmitting the response signal comprises transmitting the response signal over a wired communication link.

18. The method of claim 12 wherein transmitting the response signal comprises transmitting the response signal over an optical communication link.

19. The method of claim 12, further comprising determining a direction of the swiping touch based on the response signal.

20. The method of claim 12, further comprising determining a speed of the swiping touch based on the response signal.

21. The method of claim 12, further comprising:
   positioning the reader on product shelving; and
   disposing the input device on a product displayed on the shelving.

22. The method of claim 21, wherein generating the output comprises displaying information about the product.

23. An input device comprising one or more groups of two or more touch sensitive elements, each group of two or more touch sensitive elements arranged to generate a sequence of electronic waveforms corresponding to a multi-digit code that identifies the group in response to a swiping touch across the two or more touch sensitive elements, wherein the multi-digit code is one of:
   encoded in a spatial arrangement of the touch sensitive elements wherein the spatial arrangement correlates to timing between waveform features of the sequence of electronic waveforms;
   encoded in frequency of the electronic waveforms generated in response to the swiping touch;
   encoded in phase of electronic waveforms generated in response to the swiping touch; or
   encoded in peaks in the electronic waveforms generated in response to the swiping touch.

24. An interface system comprising:
   at least one input device comprising one or more groups that include two or more touch sensitive elements, each group of two or more touch sensitive elements arranged to generate a response signal comprising a sequence of electronic waveforms corresponding to a sequential multi-digit code that identifies the group in response to a swiping touch across the two or more touch sensitive elements;
   a signal processor configured to extract the code from the response signal; and
   an output device configured to generate an output responsive to the code, wherein the sequential multi-digit code is one of:
      encoded in peaks in the electronic waveforms generated in response to the swiping touch;
      encoded in timing between waveform features of the electronic waveforms generated in response to the swiping touch;
      encoded in a frequency of the electronic waveforms generated in response to the swiping touch; or
      encoded in a phase of the electronic waveforms generated in response to the swiping touch.

* * * * *